USOO5622918A

United States Patent [19]
Nakamura

[11] Patent Number: 5,622,918
[45] Date of Patent: Apr. 22, 1997

[54] "PROCESS AND APPARATUS FOR PREPARING YBACUO SUPERCONDUCTING FILMS"

[75] Inventor: Takao Nakamura, Osaka, Japan

[73] Assignee: Sumitomo Electric Industries, Ltd., Osaka, Japan

[21] Appl. No.: 519,640

[22] Filed: Aug. 25, 1995

[30] Foreign Application Priority Data

Aug. 26, 1994 [JP] Japan ................................ 6-225708

[51] Int. Cl.$^6$ .............................. C23C 14/24; B05D 5/12
[52] U.S. Cl. .................... 505/473; 505/732; 505/500; 505/742; 427/62; 118/715; 118/725; 118/719
[58] Field of Search .................................. 505/473, 500, 505/732, 742, 729; 118/715, 719, 725; 427/62, 63, 126.3; 117/108

[56] References Cited

U.S. PATENT DOCUMENTS

| | | | |
|---|---|---|---|
| 5,004,721 | 4/1991 | DeLozanne | 505/1 |
| 5,039,657 | 8/1991 | Goldman et al. | 505/1 |
| 5,143,896 | 9/1992 | Harada et al. | 505/1 |

FOREIGN PATENT DOCUMENTS 63-241810  10/1988  Japan.
4-193703  7/1992  Japan.

OTHER PUBLICATIONS

Achutharaman et al, Thin Solid Films, 216 (1992) pp. 14–20.

Primary Examiner—Roy V. King
Attorney, Agent, or Firm—Kerkam, Stowell, Kondracki & Clarke, P.C.; John C. Kerins

[57] ABSTRACT

A process for preparing an YBCO oxide thin film which has a crystalline, clean and smooth surface on a substrate. The process is conducted by using an apparatus comprising a vacuum chamber in which an oxidizing gas of $O_2$ including $O_3$ can be supplied near the substrate so that pressure around the substrate can be increased while maintaining high vacuum near an evaporation source and K cell evaporation sources arranged in the vacuum chamber wherein the substrate is heated, molecular beam of constituent atoms of the oxide excluding oxygen are supplied from the K cell evaporation sources, and a chilled oxidizing gas is locally supplied to the vicinity of the substrate.

13 Claims, 1 Drawing Sheet

"PROCESS AND APPARATUS FOR PREPARING YBACUO SUPERCONDUCTING FILMS"

BACKGROUND OF THE INVENTION

1. Field of the Invention

The present invention relates to a process for preparing high crystallinity oxide thin films and a film deposition apparatus for conducting the process, and more specifically to improvement of an MBE (Molecular Beam Epitaxy) process and a reactive co-evaporation process particularly for preparing oxide superconductor thin films, which has clean surfaces, high crystallinity and excellent properties.

2. Description of Related Art

Oxide superconductors have been considered to have higher critical temperatures than those of metal superconductors, and therefore to have high possibility of practical use. For example, Y-Ba-Cu-O type oxide superconductor has a critical temperature higher than 80K and it is reported that Bi-Sr-Ca-Cu-O type oxide superconductor and Tl-Ba-Ca-Cu-O type oxide superconductor have critical temperatures higher than 100K.

In case of applying the oxide superconductor to superconducting electronics including superconducting devices and superconducting integrated circuits, the oxide superconductor has to be used in the form of a thin film having a thickness of a few nanometers to some hundreds micrometers. It is considered to be preferable to utilize various deposition methods, such as sputtering methods, laser ablation methods, MBE methods and reactive co-evaporation methods for forming oxide superconductor thin films. In particular, it is possible to form an oxide superconductor thin film by depositing atomic layers layer by layer through utilizing a MBE method and a reactive co-evaporation method. Additionally, in-situ observation during and between depositing thin film is possible so that a high quality oxide superconductor thin film can be obtained by the MBE method and reactive co-evaporation method.

Insulator thin films are also necessary to fabricate superconducting devices and superconducting integrated circuits. Oxide dielectrics such as $SrTiO_3$, $MgO$, etc. are preferably used for insulator thin films combined with the oxide superconductor. In particular, $SrTiO_3$ has a layered crystal structure similar to that of the oxide superconductor so that it is possible to accurately control qualities and thickness of its thin films by depositing atomic layers layer by layer through utilizing a MBE method and a reactive co-evaporation method.

In order to deposit an oxide superconductor thin film and an oxide dielectric thin film on a substrate by the MBE method and the reactive co-evaporation method, constituent elements of the oxide excluding oxygen are supplied as molecular beams towards the substrate by using Knudsen's cell (abbreviated to K cell hereinafter) type molecular beam sources. In addition, an oxidizing gas such as $O_2$ including $O_3$, $NO_2$ or $N_2O$ is supplied near the substrate so that the molecular beams are oxidized so as to form the oxide thin film on the substrate.

In general, when a thin film is deposited by the MBE method and the reactive co-evaporation method, a pressure of deposition atmosphere is reduced as low as possible so as to prevent contamination in the process. Namely, vacuum level of the deposition atmosphere is increased as high as possible.

However, in case of an oxide thin film, a above distinctive process in which an oxidizing gas is supplied near the substrate during deposition of the oxide thin film is employed. It is also preferable, even in this case, to reduce the pressure in the vicinity of the substrate as low as possible so as to prevent contamination of impurities into the oxide thin film.

For this purpose, in a prior art, the pressure in the vicinity of the substrate has been adjusted to $1.333 \times 10^{-3}$ Pa ($1 \times 10^{-5}$ Torr) during the deposition. However, it may be sometimes difficult to cause sufficient oxidation near a surface of the substrate.

In order to resolve the above problem, the oxidizing gas is needed to have a reactivity as high as possible. Therefore, it is necessary to supply an oxidizing gas containing a large fraction of $O_3$ or $N_2O$ having high reactivity. However, in a prior art, a tip of a nozzle to supply the oxidizing gas is heated to a temperature of around 250° C. by heat radiation from the substrate and a considerable part of the nozzle is heated to a high temperature by heat conduction, so that $O_3$ and $N_2O$ are decomposed in the high-temperature part of the nozzle. This results that sufficient $O_3$ and $N_2O$ cannot be supplied to the vicinity of the substrate.

SUMMARY OF THE INVENTION

Accordingly, it is an object of the present invention to provide a process for preparing an oxide superconductor thin film which has a clean upper surface, high crystallinity and excellent superconducting characteristics without any post treatment by supplying an oxidizing gas having high oxidizing ability, which has overcome the above mentioned defects of the conventional ones.

Another object of the present invention to provide a film deposition apparatus which can supply an oxidizing gas having high oxidizing ability, which has overcome the above mentioned defects of the conventional ones.

The above and other objects of the present invention are achieved in accordance with the present invention by a process for preparing a film formed of an oxide material on a substrate by using an apparatus comprising a vacuum chamber in which an oxidizing gas can be supplied near the substrate so that pressure around the substrate can be increased while maintaining high vacuum around an evaporation source and K cell evaporation sources arranged in the vacuum chamber wherein the substrate is heated, molecular beam of constituent atoms of the oxide material excluding oxygen are supplied from the K cell evaporation sources and a chilled oxidizing gas is locally supplied to the vicinity of the substrate.

By chilling the oxidizing gas, its decomposition is prevented so that an oxidizing gas having high oxidizing ability could be supplied in the vicinity of the substrate. The oxidizing gas having high oxidizing ability contributes improvement of crystallinity, smoothness and properties of the oxide thin flint to be deposited. In addition, the oxidizing gas having high oxidizing ability broadens regions of the oxide thin film having high crystallinity, smoothness and excellent properties.

According to the present invention, the pressure of the oxidizing gas in the vicinity of the substrate is preferably $6.665 \times 10^{-5}$ to $6.665 \times 10^{-4}$ Pa ($5 \times 10^{-7}$ to $5 \times 10^{-6}$ Torr) at a background pressure of $1.333 \times 10^{-9}$ to $1.333 \times 10^{-7}$ Pa ($1 \times 10^{-11}$ to $1 \times 10^{-9}$ Torr). This quite low background pressure means that there is no leak nor any gas generation in the vacuum chamber of the film deposition apparatus. Therefore, no contaminant, for example hydrocarbons and metal carbides, is deposited on the oxide thin film prepared by the process in accordance with the present invention.

According to the present invention, the oxidizing gas is selected from the group consisting of $O_2$ including not less than 5 volume percent $O_3$, pure $N_2O$ and pure $NO_2$. These gases have higher oxidizing than pure $O_2$ and it is favorable for preparing an oxide thin film by the process.

According to one preferable embodiment of the present invention, the substrate is cooled down to the room temperature after the oxide superconductor thin film was deposited, in the atmosphere in which the oxide superconductor thin film was deposited. In case of depositing an oxide superconductor thin film, while the substrate is cooled down, the oxide superconductor crystal system of the thin film is transformed from a tetragonal system to an orthorhombic system. At this stage, the oxide superconductor thin film should be in the oxidizing atmosphere, in order to get excellent superconducting characteristics.

In one preferred embodiment, the thin film is deposited while the oxidizing gas is struck onto a deposition surface of the substrate. By this, the pressure of the oxidizing gas on the deposition surface of the substrate was further elevated.

In a preferred embodiment, the oxide is formed of a high-$T_c$ (high critical temperature) oxide superconductor, particularly, formed of a high-$T_c$ copper-oxide type compound oxide superconductor for example a Y-Ba-Cu-O type compound oxide superconductor material, a Bi-Sr-Ca-Cu-O type compound oxide superconductor material, and a Tl-Ba-Ca-Cu-O type compound oxide superconductor material.

In case of $Y_1Ba_2Cu_3O_{7-\delta}$ oxide superconductor, the reactive co-evaporation is preferably effected at a substrate temperature of 650° to 730° C. by using metal yttrium, metal barium and metal copper as evaporation sources. It is more preferable that the reactive co-evaporation is effected at a substrate temperature of 700° C. If the substrate temperature is lower than 650° C., the obtained $Y_1Ba_2Cu_3O_{7-\delta}$ oxide superconductor thin film constituted of polycrystals which includes c-axis orientated crystals and a-axis orientated crystals. On the contrary, if the substrate temperature exceeds 730° C., metal copper molecules are not oxidized so that the $Y_1Ba_2Cu_3O_{7-\delta}$ oxide superconductor can not obtained.

It is preferable that the temperature of the K cell of the metal yttrium is 1150° to 1350° C., more preferable 1220° C., the temperature of the K cell of the metal barium is 570° to 640° C., more preferable 620° C., and the temperature of the K cell of the metal copper is 950° to 1090° C., more preferable 1000° C. The temperatures of the K cells are determined by geometric arrangement of the Film deposition apparatus and the material which constitutes the crucibles.

The substrate can be formed of an insulating substrate, preferably an oxide single crystal substrate such as MgO, $SrTiO_3$, $CdNdAlO_4$, etc. These substrate materials are very effective in forming or growing a crystalline film having a high degree of crystallinity.

According to another aspect of the invention, there is provided a film deposition apparatus comprising:

a vacuum chamber provided with a partitioning means for dividing the vacuum chamber into a first sub-chamber and a second sub-chamber, the partitioning means including an opening for introducing a vacuum conductance for molecular flows between the first sub-chamber and the second sub-chamber so that a pressure difference can be created between the first sub-chamber and the second sub-chamber even when the opening is open;

a gate valve provided on the partitioning means for hermetically closing the opening of the partitioning means so as to shut off the molecular flows between the first sub-chamber and the second sub-chamber;

at least two evaporation source sets each comprising at least one K cell provided in the vacuum chamber in communication with an internal space of the vacuum chamber and designed to deposit a thin film at different deposition positions in the second sub-chamber;

a main evacuating means coupled to the first sub-chamber for evacuating the first sub-chamber to an ultra high vacuum;

a sample holder located within the second sub-chamber having at least one head for holding substrate to be deposited;

means for heating the substrate;

a gas supplying means provided in the second sub-chamber so as to supply a predetermined gas to the second sub-chamber;

means for chilling the gas supplied to the second sub-chamber; and an auxiliary evacuating means coupled to the second sub-chamber for evacuating the second sub-chamber to an ultra-high vacuum even when the gate valve is closed. The gas chilling means preferably comprises a heat conduction member contact with the gas supply means and cold trap to which the heat conduction member is attached.

The above and other objects, features and advantages of the present invention will be apparent from the following description of preferred embodiments of the invention with reference to the accompanying drawings.

BRIEF DESCRIPTION OF THE DRAWINGS

The attached FIGURE is a diagrammatic sectional view of a film deposition apparatus according to the present invention, which is used for carrying out the process in accordance with the present invention.

DESCRIPTION OF THE PREFERRED EMBODIMENTS

Figure 1:
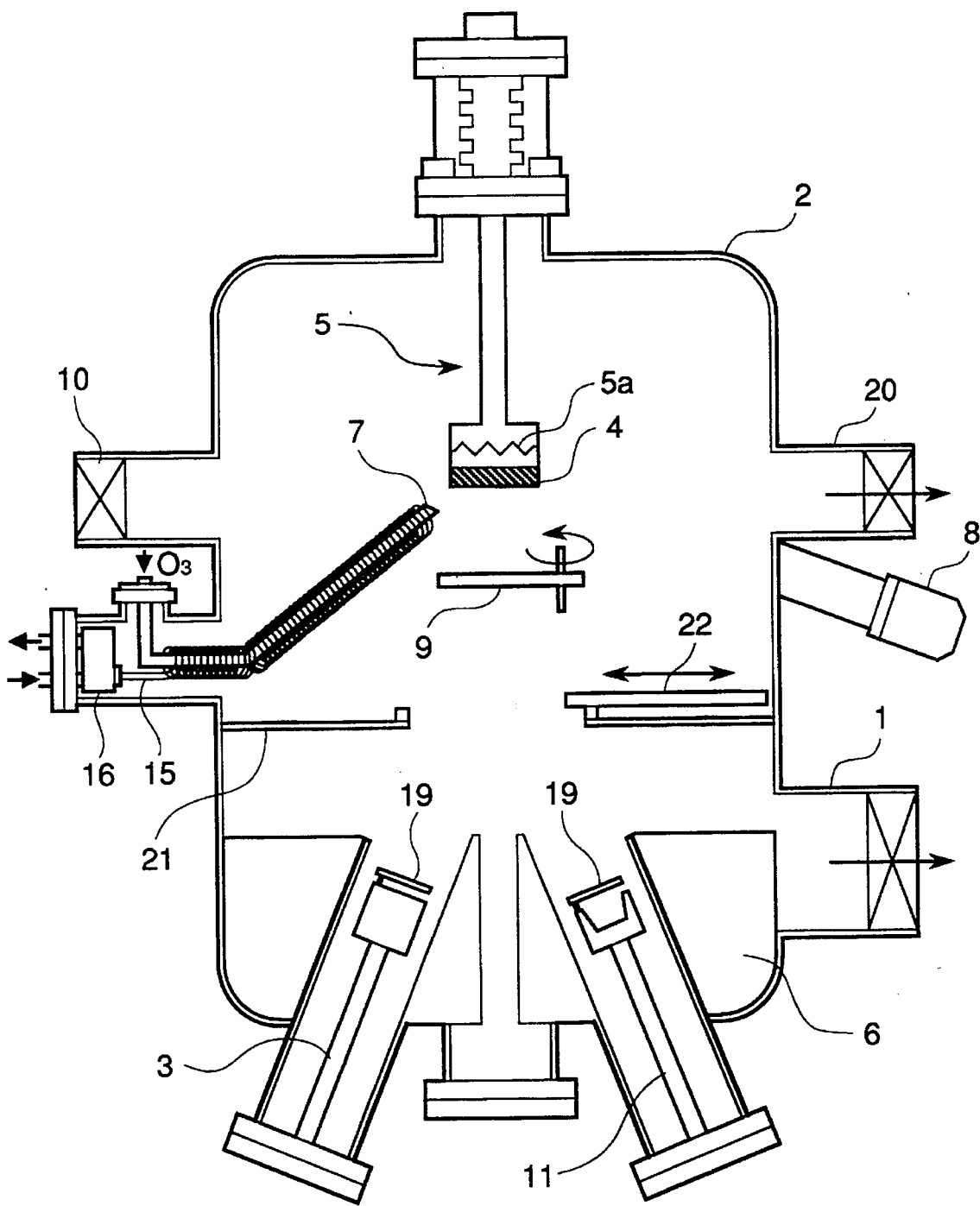

Referring to the attached FIGURE, there is shown a diagrammatic sectional view of a film deposition apparatus which can be used for carrying out the process in accordance with the present invention.

The shown film deposition apparatus basically includes a vacuum chamber 2 provided with a main evacuating apparatus 1, at least one K (Knudsen's) cell 3 and at least one electron beam gun 11 provided at a bottom of the vacuum chamber 2, and a sample holder 5 provided at a top of the vacuum chamber 2 for holding a substrate 4 on which a film is to be deposited. The sample holder 5 is associated with a heater 5a for heating the substrate. In addition, the vacuum chamber 2 is also provided with a port 10 for exchanging a sample, a liquid nitrogen shroud 6 for forming a cold trap around an evaporation source of the K cell 3, and a RHEED (Reflective High Energy Electron Diffraction) device 8 for observing a thin film roughness during the deposition. In front of the substrate held by the sample holder, a shutter 9 is located for controlling a deposition time during the deposition process. The K cell 3 and the electron beam gun 11 are provided with an openable shutter 19.

In addition, the film deposition apparatus additionally includes a partitioning plate 21 for dividing the vacuum chamber 2 into a first sub-chamber which is constituted of a lower portion of the vacuum chamber defined below the partitioning plate 21 and which is coupled to the K cell 3, the electron beam gun 11 and the main evacuating apparatus 1, and a second sub-chamber which is constituted of an upper portion of the vacuum chamber defined above the partitioning plate 21 and in which sample holder 5 is located. The partitioning plate 21 includes a through opening 23 formed at a center thereof. The position of the opening 23 is determined to ensure that a beam emitted from K cell 3 and the electron beam gun 11 toward the substrate 4 is not obstructed by the partitioning plate 21. In addition, the size of the opening 23 is determined to enable restricted molecular flows between the first sub-chamber and the second sub-chamber so that a pressure difference can be created between the first sub-chamber and the second sub-chamber when the opening 23 is open. Therefore, the partitioning plate 21 having the through opening 23 constitutes a vacuum impedance.

A gate valve 22 is provided on the partitioning plate 21 for hermetically closing the opening 23 of the partitioning plate 21, so as to completely shut off the molecular flows between the first sub-chamber and the second sub-chamber when the gate valve 22 is closed. An opening and closing of this gate valve 22 is controlled from the outside of the film deposition apparatus by a not-shown means.

Furthermore, an auxiliary evacuating apparatus 20 is coupled to the second sub-chamber for evacuating the second sub-chamber to an ultra-high vacuum when the gate valve 22 is closed. The auxiliary evacuating apparatus 20 is constituted of a cryopump. On the other hand, the main evacuating apparatus 1 is constituted of a diffusion pump.

In addition, a gas supplying nozzle 7 is provided so as to introduce an oxidizing gas such as $O_2$, $O_3$, $NO_2$, $N_2O$, etc. in proximity of the substrate 4 held by the sample holder 5, so that the oxidizing gas can be supplied to form an oxygen-enriched atmosphere in the proximity of the substrate 4 in order to oxidize metal molecular beams incoming from the evaporation source in the course of the film deposition. A heat conductor 15 of a copper tape of which one end is attached to a liquid nitrogen trap 16 is wound around the gas supplying nozzle 7 to chill the gas supplying nozzle 7 by heat conduction. Liquid nitrogen flows through the liquid nitrogen trap 16.

The chilled gas supplying nozzle 7 prevents decomposition of $O_3$ or $N_2O$ so that an oxidizing gas having high oxidizing ability can be supplied to the vicinity of the substrate 4.

According to the present invention, c-axis orientated $Y_1Ba_2Cu_3O_{7-\delta}$ oxide superconductor thin film were prepared by using the apparatus of the attached FIGURE.

First, a $SrTiO_3$ (100) substrate 4 was set to the sample holder 5, and metal yttrium, metal barium and metal copper were set to three different K cells 3 as evaporation sources. Thereafter, the chamber 2 was closed and the gate valve 22 was opened. The vacuum chamber 2 was evacuated by the main evacuating apparatus 1 and the auxiliary evacuating apparatus 20 to an ultra-high vacuum of which the pressure was lower than $1.333 \times 10^{-7}$ Pa ($1 \times 10^{-9}$ Torr) in which background pressure the film deposition by the co-evaporation process was available. Succeedingly, an oxidizing gas of $O_2$ including 70 volume percent $O_3$ was supplied from the nozzle 7 so that the pressure near the substrate 4 in the second chamber became $6.665 \times 10^{-3}$ Pa ($5 \times 10^{-5}$ Torr).

As mentioned above, the vacuum chamber 2 was provided with the vacuum impedance (the partitioning plate 21 having the through opening 23), a pressure difference of about one digit or more was created between the first sub-chamber and the second sub-chamber. Pressure of the first sub-chamber was maintained ultra low so that metals evaporation sources were not oxidized and vapors could be efficiently generated after the oxidizing was supplied. In addition, the oxidizing gas jetted from the nozzle 7 was struck onto a deposition surface of the substrate, the pressure of the oxidizing gas on the deposition surface of the substrate was further elevated.

Then, the substrate 4 was heated by the heater 5a to a temperature of 700° C. The K cell 3 of metal yttrium was heated to a temperature of 1220° C., the K cell 3 of metal barium was heated to a temperature of 620° C. and the K cell 3 of metal copper was heated to a temperature of 1000° C. The substrate temperature was preferably 650° to 730° C., the temperature of the K cell of the metal yttrium was preferably 1150° to 1350° C., more preferably 1220° C., the temperature of the K cell of the metal barium was preferably 570° to 640° C., more preferably 620° C., and the temperature of the K cell of the metal copper was preferably 950° to 1090° C., more preferably 1000° C.

According to the present invention, the nozzle 7 was chilled by heat conduction of the copper tape 15 so that a temperature of the tip of the nozzle 7 became 150° C. or lower and the other part of the nozzle 7 about 10 millimeters or more away from its tip was chilled to a temperature of −50° C. or lower. In a prior art, the tip of the nozzle 7 was heated to a temperature of 250° C. or higher and a significant part of the nozzle 7 was heated to a high temperature.

According to the present invention, the low temperature of the nozzle 7 prevented decomposition of $O_3$ in the nozzle 7 and $O_3$ was decomposed only at the tip portion of the nozzle 7 having a length of about 10 millimeters so that an oxidizing gas containing a large fraction of $O_3$ could be supplied in the vicinity of the substrate 4. For example, it was ascertained by using quadrupole mass spectrometer that 50% of $O_3$ increased at a substrate temperature of 700° C. under a pressure of $6.665 \times 10^{-4}$ Pa ($5 \times 10^{-6}$ Torr). In addition, the vacuum level of the chamber 2 was improved since the the copper tape 15 and the chilled nozzle 7 also functioned as a cold trap. This is one of the advantages of the liquid nitrogen chilling of the nozzle 7 and cannot be obtained by a water cooling.

The oxidizing gas having high oxidizing ability contributes improvement of crystallinity, smoothness and superconducting properties of the oxide superconductor thin film to be deposited. In addition, the oxidizing gas having high oxidizing ability broadens regions of the oxide superconductor thin film having high crystallinity, smoothness and excellent superconducting properties.

When molecular beams had become to be stably generates from the evaporation sources, the shutters 9 and 19 were opened so as to start deposition of the oxide superconductor thin film onto the substrate 4. At this time, a surface roughness of this deposited film was observed by the RHEED device 8. The oxide superconductor thin films were grown up to a thickness of 90 nanometers at a deposition rate of 1 nanometer/minute. The deposition rate is preferably 0.5 to 2 nanometers/minute.

When the oxide superconductor thin film had reached a thickness of 90 nanometers, the substrate 4 was cooled down to the room temperature. While the substrate 4 was cooled down, it was maintained in the condition in which the oxide superconductor thin film was deposited.

After the oxide superconductor thin film were obtained, crystal structures and surface conditions of the oxide superconductor thin films were evaluated RHEED, LEED (Low Energy Electron Diffraction) and XPS (X-ray Photoelectron Spectroscopy) without exposing the oxide superconductor thin film to the air.

In RHEED images of the oxide superconductor thin films, streak patterns were observed, which showed that the oxide superconductor thin films had planar and crystalline surfaces. In LEED images, some 1×1 spots were observed, which revealed such a fact that the oxide superconductor thin film had clean and crystalline surfaces. In XPS spectra of the oxide superconductor thin films, no peak of C was observed and intensive satellite peaks of Cu were observed. This revealed such a fact that that there was no composition of C which was one of contaminants on the surface of the oxide superconductor thin films and the surfaces of the oxide superconductor thin films had excellent superconductivity.

Furthermore, a uniform and high quality oxide superconductor thin film having the above clean, crystallinity and superconductive surface was grown on the entire surface of each substrate. A high quality oxide superconductor thin film was grown on only a portion near the tip of the nozzle 7 of the substrate 4 when the oxide superconductor thin film was deposited by a method according to a prior art in which the nozzle 7 was not chilled.

Then, thin films of $SrTiO_3$ dielectric oxide were deposited on the above $Y_1Ba_2Cu_3O_{7-\delta}$ oxide superconductor thin film by using the same apparatus.

After the observation of the oxide superconductor thin film, an oxidizing gas of $O_2$ including more than 70 volume percent $O_3$ was again supplied from the nozzle 7 so as to increase the pressure in the vicinity of the substrate 4 to $1.333 \times 10^{-4}$ Pa ($1 \times 10^{-6}$ Torr).

Main conditions for depositing the $SrTiO_3$ thin films are as follows:

| | |
|---|---|
| Substrate temperature: | 480° C. |
| Pressure (near the substrate): | $3.999 \times 10^{-3}$ Pa ($3 \times 10^{-5}$ Torr) ($O_2$ including $O_3$ at 70 vol. % or more) |
| Evaporation source and crucible (K cell) temperature | |
| Sr: | 600° C. |
| Ti: | 1500.° C. |
| Film thickness | 250 nanometers |

The substrate temperature is preferably 430° to 580° C., the temperature of metal strontium is preferably 450° to 600° C. and the temperature of metal titanium is preferably 1430° C. to 1550° C.

When the dielectric oxide thin film had reached a predetermined thickness, the substrate 4 was cooled down to the room temperature. While the substrate 4 was cooled down, it was maintained in the condition in which the dielectric oxide thin film was deposited.

After the dielectric oxide thin film was deposited on the oxide superconductor thin film, a crystal structure and a surface condition of the layered film was evaluated without exposing the layered film to the air. By the observation, it became clear that the layered films prepared in accordance with the present invention had extremely smooth surfaces and the lower $Y_1Ba_2Cu_3O_{7-\delta}$ oxide superconductor thin films and the upper $SrTiO_3$ thin films were highly crystallized. In addition, interfaces between the lower $Y_1Ba_2Cu_3O_{7-\delta}$ oxide superconductor thin films and the upper $SrTiO_3$ thin films were clearly formed.

As explained above, an oxide thin film which has an excellent surface condition can be obtained without any post-deposition treatment by the process in accordance with the present invention. The oxide thin film prepared by the process in accordance with the present invention has a highly crystalline, clean and planar surface. In addition, according to the present invention, it is possible to deposit an uniform oxide thin film having no quality distribution on the whole surface of a substrate. A high performance superconducting device which has not yet obtained can be fabricated by applying the present invention to preparation of a superconducting element and a superconducting integrated circuit.

The invention has thus been shown and described with reference to the specific embodiments. However, it should be noted that the present invention is in no way limited to the details of the illustrated structures but converts and modifications may be made within the scope of the appended claims.

I claim:

1. A process for preparing a film formed of a YBaCuO superconducting oxide material on a substrate by using an apparatus comprising a vacuum chamber, supplying an oxidizing gas near the substrate so that pressure around the substrate is increased while maintaining high vacuum around an evaporation source and K cell evaporation sources arranged in the vacuum chamber wherein the substrate is heated, supplying a molecular beam of constituent atoms of the YBaCuO oxide material excluding oxygen from the K cell evaporation sources and chilling said oxidizing gas in a supply line extending into said vacuum chamber and locally supplying said oxidizing gas through the supply line to the vicinity of the substrate.

2. A process as claimed in claim 1; wherein the pressure of the oxidizing gas in the vicinity of the substrate is $6.665 \times 10^{-5}$ to $6.665 \times 10^{-4}$ Pa ($5 \times 10^{-7}$ to $5 \times 10^{-6}$ Torr) at a background pressure of $1.333 \times 10^{-9}$ to $1.333 \times 10^{-7}$ Pa ($1 \times 10^{-11}$ to $1 \times 10^{-9}$ Torr).

3. A process as claimed in claim 1; wherein the oxidizing gas is $O_2$ including $O_3$.

4. A process as claimed in claim 3; wherein the oxidizing gas is $O_2$ including not less than 70 volume percent $O_3$.

5. A process as claimed in claim 1; wherein the substrate is cooled down to the room temperature after the oxide superconductor film has been deposited, in the atmosphere in which the oxide superconductor film was deposited.

6. A process as claimed in claim 1; wherein the oxidizing gas is struck onto a deposition surface of the substrate during the deposition.

7. A process as claimed in claim 1; wherein the thin film is deposited at a substrate temperature 650° to 730° C.

8. A process as claimed in claim 7; wherein the reactive co-evaporation is carried out at a substrate temperature 700° C.

9. A process as claimed in claim 1; wherein metal yttrium, metal barium and metal copper are used as evaporation sources.

10. A process as claimed in claim 9; wherein the reactive co-evaporation is carried out at a temperature of the K cell of the metal yttrium of 1150° to 1350° C., at a temperature of the K cell of the metal barium of 570° to 640° C. and at a temperature of the K cell of the metal copper of 950° to 1090° C.

11. A process as claimed in claim 9; wherein the reactive co-evaporation is carried out at a temperature of the K cell of the metal yttrium of 1220° C., at a temperature of the K cell of the metal barium of 620° C. and at a temperature of the K cell of the metal copper of 1000° C.

12. Apparatus for deposition of a YBaCuO superconducting film comprising:

a vacuum chamber provided with a partitioning means for dividing said vacuum chamber into a first sub-chamber and a second sub-chamber, said partitioning means including an opening for introducing a vacuum conductance for molecular flows between said first sub-chamber and said second sub-chamber so that a pressure difference can be created between said first sub-chamber and said second sub-chamber even when said opening is open;

a gate valve provided on said partitioning means for hermetically closing said opening of said partitioning means so as to shut off the molecular flows between said first sub-chamber and said second sub-chamber;

at least two evaporation source sets each comprising at least one K cell provided in said vacuum chamber in communication with an internal space of said vacuum chamber and designed to deposit a thin film at different deposition positions in said second sub-chamber;

at least one of said evaporation source sets having one or more K cells containing Y, Ba and Cu;

a main evacuating means coupled to said first sub-chamber for evacuating said first sub-chamber to an ultra high vacuum;

a sample holder located within said second sub-chamber having at least one head for holding a substrate on which the YBaCuO film is to be deposited;

means for heating said substrate;

a gas supply line extending into said second sub-chamber so as to supply a predetermined gas to said second sub-chamber;

means for chilling the gas supply line to chill the gas supplied to said second sub-chamber when said gas is passed through said gas supply line; and an auxiliary evacuating means coupled to said second sub-chamber for evacuating said second sub-chamber to an ultra-high vacuum even when said gate valve is closed.

13. A film deposition apparatus as claimed in claim 12; wherein said gas chilling means comprises a heat conduction member contact with said gas supply means and cold trap to which said heat conduction member is attached.

* * * * *